United States Patent [19]

Murakami et al.

[11] Patent Number: 5,431,738

[45] Date of Patent: Jul. 11, 1995

[54] APPARATUS FOR GROWING GROUP II-VI MIXED COMPOUND SEMICONDUCTOR

[75] Inventors: Satoshi Murakami; Yoichiro Sakachi; Hironori Nishino; Tetsuo Saito; Kenji Maruyama, all of Kawasaki, Japan

[73] Assignee: Fujitsu Limited, Kawasaki, Japan

[21] Appl. No.: 202,584

[22] Filed: Feb. 28, 1994

Related U.S. Application Data

[62] Division of Ser. No. 850,023, Mar. 12, 1992, Pat. No. 5,324,386.

[30] Foreign Application Priority Data

Mar. 19, 1991 [JP] Japan .................................. 3-54974
Jun. 28, 1991 [JP] Japan .................................. 3-158241

[51] Int. Cl.$^6$ .............................................. C23C 16/00
[52] U.S. Cl. .................................... 118/730; 118/715; 118/729
[58] Field of Search ................. 118/715, 725, 730, 729

[56] References Cited

U.S. PATENT DOCUMENTS

| | | | |
|---|---|---|---|
| 4,439,267 | 3/1984 | Jackson, Jr. ..................... | 156/614 |
| 4,568,397 | 2/1986 | Hoke et al. ...................... | 156/613 |
| 4,650,539 | 3/1987 | Irvine et al. ..................... | 156/613 |
| 4,904,337 | 2/1990 | Elliott et al. ..................... | 156/614 |
| 4,980,204 | 12/1990 | Fujii et al. ....................... | 118/725 |
| 5,256,205 | 10/1993 | Schmitt ............................ | 118/730 |

FOREIGN PATENT DOCUMENTS 0318395 5/1989 European Pat. Off. .
62-297296 12/1987 Japan .
1-140712 6/1989 Japan .
3-271195 3/1990 Japan .
4-39921 2/1992 Japan .

OTHER PUBLICATIONS

Tompa et al., "MOVPE growth of II–VI compounds in a vertical reactor with high–speed horizontal rotating disk", *J. Crystal Growth*, 107 (1991), Nos. $\frac{1}{4}$, pp. 198–202, Amsterdam, NL.

Primary Examiner—Richard Bueker
Attorney, Agent, or Firm—Staas & Halsey

[57] ABSTRACT

A method or growing a mixed compound semiconductor layer comprises the following steps of: providing a reaction chamber comprising a rotatable substrate stage, a plurality of nozzles aligned in a line, the nozzle being arranged vertical to a substrate surface, and a mechanism for moving the substrate stage at least in the nozzle alignment direction and parallel to the substrate surface; disposing the substrate on the substrate stage which is rotated around its axis; flowing a mixed source gas into the reaction chamber through the nozzles, thereby a flow rate of the most reactive gas in the mixed source gas flowing through each nozzle being controlled to increase depending on a distance between the center axis of the substrate rotation and the nozzle; and heating the substrate. An apparatus for applying the above method comprises a particular feature for moving the substrate stage.

5 Claims, 6 Drawing Sheets

APPARATUS FOR GROWING GROUP II-VI MIXED COMPOUND SEMICONDUCTOR

This application is a division of application Ser. No. 07/850,023, filed Mar. 12, 1992, now U.S. Pat. No. 5,324,386.

BACKGROUND OF THE INVENTION

1. Field of the Invention

This invention relates to a method of growing a mixed compound semiconductor by vapor phase epitaxy and an apparatus used therefor, and more particularly to the method of growing a group II-VI mixed compound semiconductor layer of $Hg_{1-x}Cd_xTe$ and an apparatus used therefor.

The compound semiconductor $Hg_{1-x}Cd_xTe$ has a characteristic of a small energy bandgap and is known as a detector material for infrared rays. The mixing ratio x included in the above expression $Hg_{1-x}Cd_xTe$ is defined as a ratio of binary compound semiconductor CdTe comprised in ternary compound semiconductor HgCdTe and plays an important role to determine the most sensitive wavelength of infrared rays in detection. The present invention relates to the method and apparatus for growing a compound semiconductor layer of $Hg_{1-x}Cd_xTe$ having a uniform x-value throughout the entire grown crystal layer on a substrate.

2. Description of the Related Art

A general concept of growing a mixed compound semiconductor layer of $Hg_{1-x}Cd_xTe$ using an apparatus comprising a reactor chamber of a vertical type is first explained using FIG. 1. FIG. 1 shows a schematic cross sectional view of the apparatus, wherein a substrate 3 of such as gallium arsenide (GaAs) is disposed on a substrate stage 2 which is rotated around the axis of a center support 10 during the growth. A mixed source gas for growth is supplied into the reactor chamber 1 through a nozzle 4 and the source gas is spouted out vertically onto the substrate 3. In FIG. 1, only a single nozzle is illustrated, however, a plurality of nozzle can be substituted therefor. The reactor chamber 1 is arranged on a fixed flange 6 with which an outlet pipe 7 is provided for exhaust. A RF coil 5 is arrange outside the reactor chamber 1 for heating the substrate stage 2 which is made of graphite.

A plurality of gas sources are provided which are shown in FIG. 2. A mercury (Hg) bubbler 30 supplies mercury vapor contained in a bubbling hydrogen gas. The mercury bubbler 30 comprises a valve 22, a mass flow controller 23, and a pressure gauge 28. A hydrogen gas is supplied to two mass flow controllers 23 and a partial pressure of mercury contained the mixed hydrogen source gas is precisely controlled. The similar bubblers 32 and 34 for tellurium and cadmium are respectively also provided, but the details are omitted in FIG. 2 for simplicity. A di-isopropyltelluride (abbreviated hereinafter as DIP-Te) bubbler 32 supplies DIP-Te vapor contained in a bubbling hydrogen gas. A dimethylcadmium (abbreviated hereinafter as DM-Cd) bubbler 34 supplies DM-Cd vapor contained in a bubbling hydrogen gas.

During the growth, the above three source gases are mixed and introduced into the reactor chamber 1 through the gas nozzle 4, and the mixed gas is spouted out onto the substrate 3. The rotating substrate stage 2 together with the substrate 3 is heated by the RF coil 5. DIP-Te and DM-Cd source gases are decomposed into element gases, and the decomposed elements and Hg of the Hg source gas react with each other in the reactor chamber 1 forming mixed compound semiconductor $Hg_{1-x}Cd_xTe$, which deposits on the substrate 3 epitaxially on the substrate. The method falls under the category called MOCVD (Metal Organic Chemical Vapor Deposition).

The above method includes the problem that, when source gases are heated in the reaction chamber 1, binary compound semiconductor CdTe is formed much easier than the formation of binary compound semiconductor HgTe. Most of decomposed Cd molecules are consumed on the substrate surface area directly under the nozzle 4, since formation energy of CdTe is smaller than that of HgTe. This results in forming $Hg_{1-x}Cd_xTe$ compound layer which has a higher x-value on the central portion of the substrate 3 and a lower x-value on the peripheral substrate area thereof. Therefore, the x-value of the grown ternary compound semiconductor $Hg_{1-x}Cd_xTe$ is not uniform on the substrate surface.

This is schematically shown in FIG. 3. The abscissa shows a position on the substrate 3 which has a diameter 2 r, and the ordinate shows an x-value of the grown compound semiconductor $Hg_{1-x}Cd_xTe$ layer. FIG. 3 shows that the grown ternary semiconductor $Hg_{1-x}Cd_xTe$ has a composition such that the x-value thereof has a peak value at the center of the substrate 3 and gradually decreases toward the periphery thereof.

A plurality of nozzles are used in order to improve a uniformity in x-values of the grown semiconductor. An exemplary result is shown in FIG. 4, in which four nozzles 4-1 to 4-4 are utilized. The result shows a remarkable improvement compared with that shown in FIG. 3, however, fluctuation in x-values is not improved to a satisfactory level.

In order to improve uniformity of the grown semiconductor, the following patent applications have been published. Japanese Unexamined Patent Publication SHO 62-297296 published Dec. 24, 1987 discloses an MOCVD apparatus, wherein a substrate is disposed on a susceptor and rotates around the center axis thereof, the substrate surface is arranged to be parallel to the gas flow direction, and further the susceptor can move back and forth in the transversal direction to the gas flow. Japanese Unexamined Patent Publication HEI 1-140712 published Jun. 1, 1989 (the same patent was filed to the US PTO and allowed as U.S. Pat. No. 4,980,204) discloses a CVD apparatus similar as that described in FIG. 4, wherein each gas flow through a plurality of nozzles is individually and precisely controlled. Further, Japanese Unexamined Patent Publication HEI 3-271195 published Dec. 3, 1991 discloses a mechanism for moving a substrate stage in a CVD apparatus, in which a substrate disposed on a substrate stage rotates around the center axis of the substrate and the rotating substrate stage further revolves around the center axis of the CVD apparatus, whereby the substrate stage moves back and forth inwardly and outwardly in the radial direction.

SUMMARY OF THE INVENTION

It is a general object of the invention to provide a method of growing a mixed compound semiconductor layer on a substrate having an extremely uniform mixing ratio on the substrate surface.

It is another object of the invention to provide an apparatus for applying the above method of growing a mixed compound semiconductor layer.

It is still another object of the invention to provide a method of growing a group II-VI mixed compound semiconductor $Hg_{1-x}Cd_xTe$ layer having almost constant x-values over an entire substrate surface.

It is a further object of the invention to provide an apparatus for applying the above method of growing the mixed compound semiconductor $Hg_{1-x}Cd_xTe$ layer on a substrate.

According to the present invention, these and other objects are achieved by a method of growing a mixed compound semiconductor layer comprising at least three elements utilizing a plurality of source gases, wherein one of source gases is far reactive with another source gas with less amount of applied energy in forming a compound semiconductor, and the method comprises the steps of:

providing a reaction chamber comprising a rotatable substrate stage for disposing a substrate thereon, either a single or a plurality of nozzles aligned in a line, the nozzle being arranged that gas is spouted out vertically onto the substrate surface, and a mechanism for moving the substrate stage at least in the nozzle alignment direction and parallel to the substrate surface; disposing a substrate on the substrate stage which is rotated around its axis; flowing the mixed source gas into the reaction chamber through the nozzle, thereby a flow rate of the most reactive gas in the mixed source gas flowing through the nozzle being controlled to increase depending on a distance between the center axis of the substrate rotation and the nozzle; and heating the substrate.

In order to apply the above method of growing a mixed compound semiconductor, the present invention provides an apparatus which comprises the similar conventional structure of such as a reactor chamber arranged on a fixed flange, a substrate stage and a center support fixed thereto, the center support being rotatable around the center axis thereof, a substrate disposed on the substrate stage, either a single or a plurality of nozzles aligned in a line, the nozzle being arranged that gas is spouted out vertically onto the substrate surface, and a heater for heating the substrate, however, the apparatus of the invention further comprises:

a mechanism for moving the center support of the substrate stage at least in the nozzle alignment direction and parallel to the substrate surface, and a controller for controlling gas flow rate through either the single nozzle or each of the plurality of nozzles depending on a distance between the center axis of the substrate rotation and the nozzle.

Other aspects, objects, and the several advantages of the invention will become apparent to one skilled in the art from the reading of the following disclosure with reference to the drawings.

BRIEF DESCRIPTION OF THE DRAWINGS

Same or like reference numerals designate same or similar parts throughout the drawings.

DETAILED DESCRIPTION OF THE PREFERRED EMBODIMENTS

Figure 1:
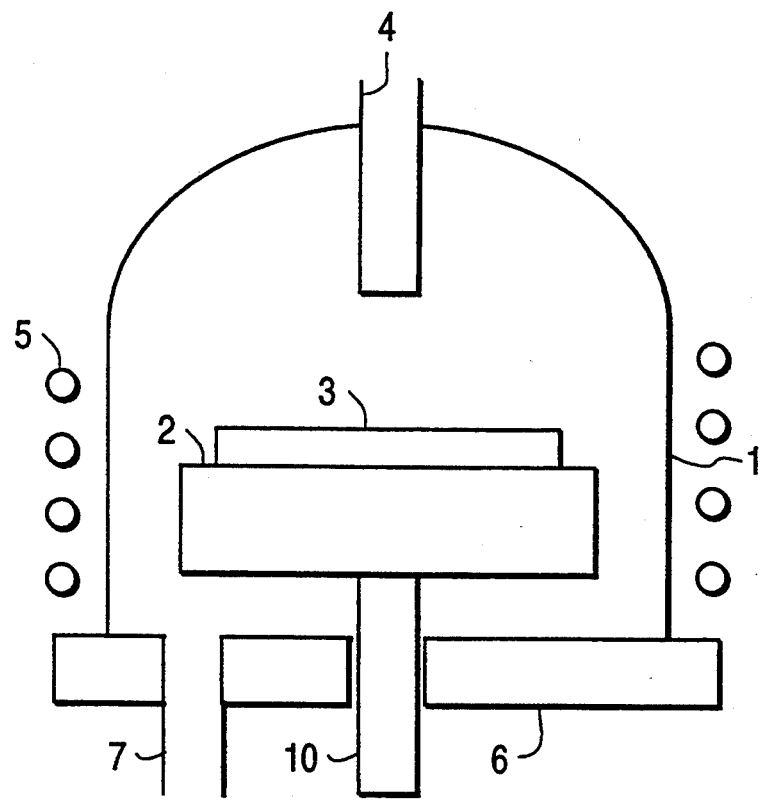
FIG. 1 shows a schematic cross sectional view of a main portion of the prior art apparatus for growing mixed compound semiconductor layer.
Figure 2:
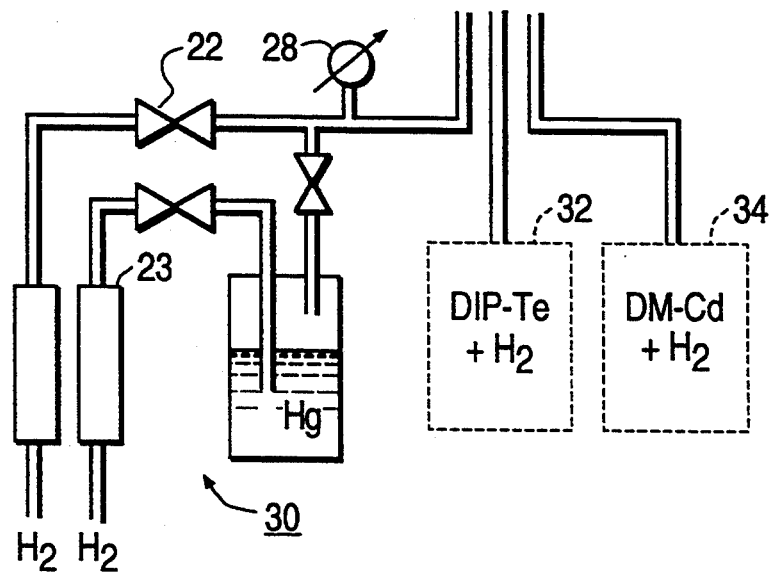
FIG. 2 shows a plurality of gas sources, which mercury (Hg) source gas is formed by flowing hydrogen gas through a bubbler, and other di-isopropyltelluride (DIP-Te) and dimethylcadmium (DM-Cd) source gases are shown in a simplified form.
Figure 3:
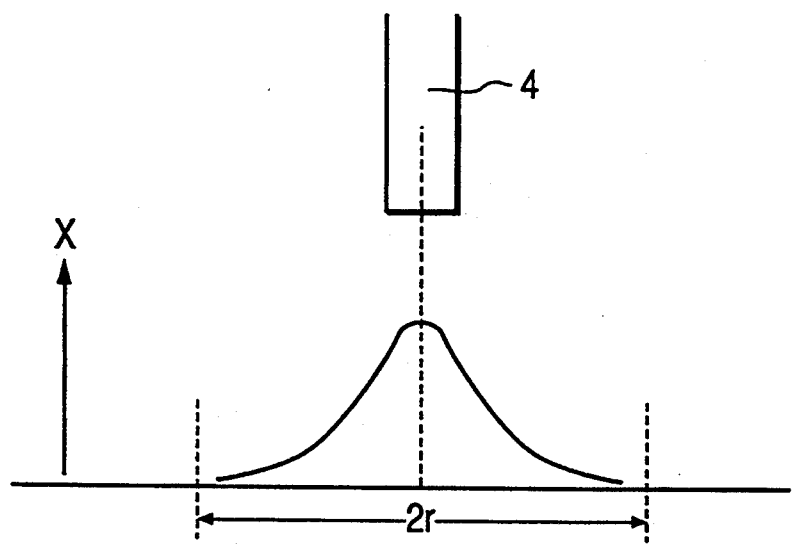
FIG. 3 shows schematically the prior art x-value distribution of $Hg_{1-x}Cd_xTe$ layer on a substrate surface using a single nozzle for supplying source gases.
Figure 4:
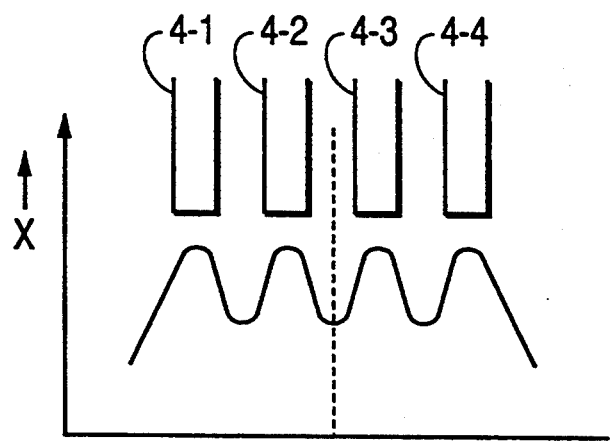
FIG. 4 shows schematically the prior art value distribution of $Hg_{1-x}Cd_xTe$ layer on a substrate surface using four nozzles for supplying source gases.
Figure 5:
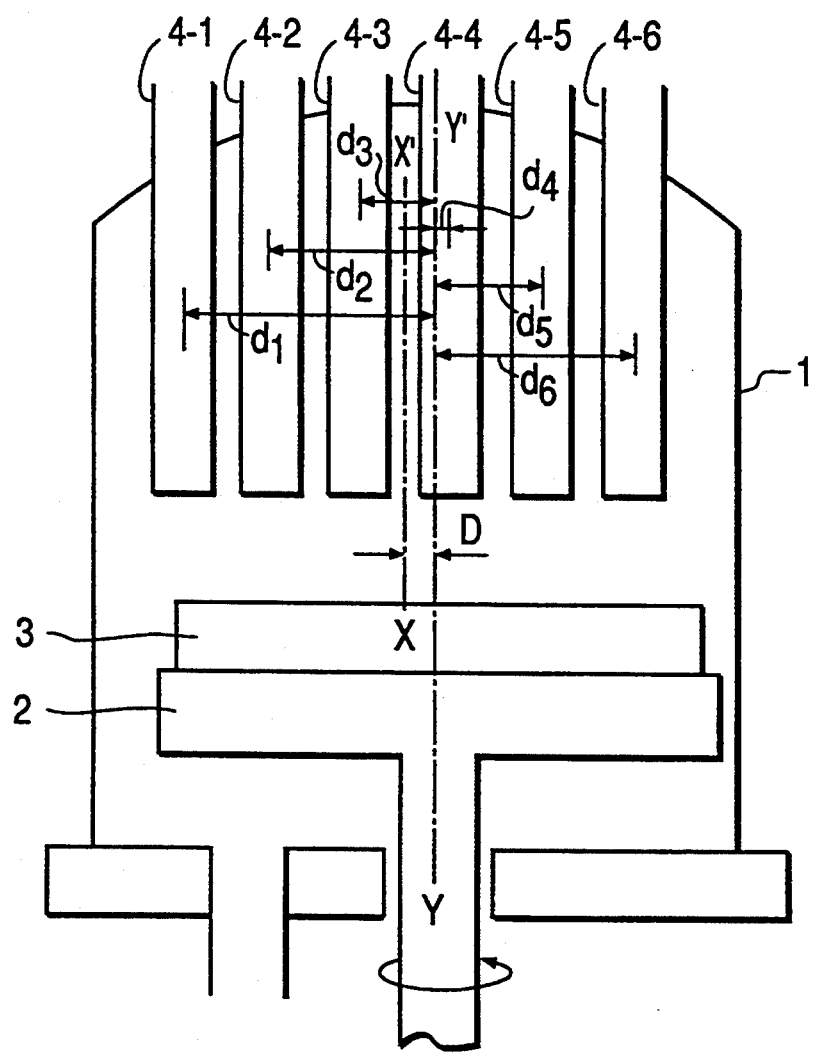
FIG. 5 shows a schematic cross sectional view of a main portion of an apparatus for applying a first embodied method of the present invention, in which a substrate stage shifts toward the right side by a deviation D.

A first method of growing a mixed compound semiconductor $Hg_{1-x}Cd_xTe$ in accordance with the present invention is explained using FIG. 5. An apparatus used therein is similar as that shown in FIG. 4. The apparatus comprises a reactor chamber 1 of quartz and a substrate stage 2 which is heated by a RF coil (not shown), and a substrate 3 of three inches in diameter is disposed on the substrate stage 2.

The apparatus utilizes six source gas nozzles 4-1, 4-2, to 4-6 aligned in a line, however, as a specific feature of the present invention, the center line of symmetrical nozzle alignment shown by a dot-and-dash line X—X' deviates from a rotation axis (shown by a dot-dash-line Y—Y') of a substrate 3. In the embodiment, each nozzle has an inside diameter of 10 mm and a pitch between two neighboring nozzles is set at 16 mm and a distance between nozzle tip and substrate surface is set at about 25 mm, and further a deviation distance D between lines X—X' and Y—Y' is set at 4 mm. The distance D is about one fourth or the nozzle pitch.

In growing $Hg_{1-x}Cd_xTe$ compound semiconductor, three source gases of Hg, DIP-TE and DM-Cd, each bubbled by a hydrogen carrier gas, are mixed and supplied to nozzles 4-1 to 4-6. The substrate is heated at a temperature of about 350° C., and a gas flow rate to each nozzle is controlled at about 1 l/min. In the embodiment, partial pressures of Hg and DIP-Te source gases to six nozzles are equally maintained at $1.0 \times 10^{-2}$ atm for Hg source gas and $1.0 \times 10^{-4}$ atm for DIP-Te source gas.

However, as a second specific feature of the invention, partial pressures of DM-Cd source gas to each nozzle are set at different values as shown in Table 1. The above Table 1 shows that partial pressure of DM-Cd varies depending on a distance d (shown $d_1$ to $d_6$ in FIG. 5) between the center axis or each nozzle and the rotation axis Y—Y'. The larger the distance d is, the higher the partial pressure is.

TABLE 1

| Nozzle No. | DM-Cd Partial Pressure in atm |
|---|---|
| 4-1 | $20 \times 10^{-5}$ |
| 4-2 | $15 \times 10^{-5}$ |
| 4-3 | $5 \times 10^{-5}$ |
| 4-4 | $1.5 \times 10^{-5}$ |
| 4-5 | $10 \times 10^{-5}$ |
| 4-6 | $15 \times 10^{-5}$ |

In FIG. 5, rotation center line Y—Y' deviates to the right side of the line X—X' by distance D, the following inequality relation exists, $$d_1 > d_6 > d_2 > d_5 > d_3 > d_4. \quad (1)$$

The above fact means that a small area portion on the substrate surface directly under the nozzle 4-1 moves at the fastest speed and that under the nozzle 4-4 moves at the slowest speed. It is found that, in order to grow $Hg_{1-x}Cd_xTe$ compound semiconductor having a uniform x-value, the partial pressure of the DM-Cd source gas in the mixed source gas should be increased depending on the surface speed of the rotating substrate under the respective nozzle. The result of the above table has proved to produce a very satisfactory uniformity of x-value.

In the prior art method in that the center line X—X' of nozzle alignment is coincident with the rotation axis of the substrate, the above inequality equation (1) is written as follows, $$d_1(=d_6) > d_2(=d_5) > d_3(=d_4). \quad (2)$$

Therefore the adjustment of DM-Cd gas flow is limited in three step change which is contrary to the six step change of the above embodiment. The increased number of steps which is caused by providing the deviation distance D by the present invention, makes it possible to control the x-value uniformity more precisely such that each nozzle works to supplement the growth on a small area between the two adjacent nozzles after a half rotation of the substrate.

the first embodiment, the substrate stage 2 rotates around the center axis, however, relative position of the center axis with regard to the nozzle alignment is stationary. In a second embodiment, a rotating stage as a whole moves with respect to the nozzle alignment, which results in a further improvement of the uniformity of x-values of grown $Hg_{1-x}Cd_xTe$ compound semiconductor.

Figure 6:
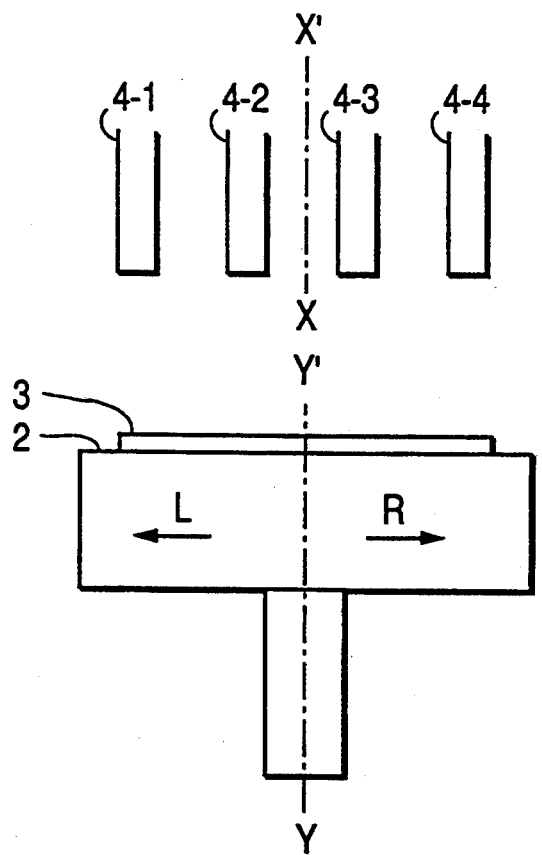
FIG. 6 shows a schematic cross sectional view of a relative disposition of four nozzles and a substrate stage when substrate stage is located at the neutral position in a second embodied method, in which the substrate stage moves toward right and left periodically.

FIG. 6 is a schematic cross sectional view of a main arrangement of substrate and nozzles only in the second embodiment for explaining the principle of the invention. In this case, four nozzles 4-1 to 4-4 are utilized, and a substrate stage 2 moves step by step in the transversal direction (horizontal direction in FIG. 6) to the gas flow in the following manner. In FIG. 6, the substrate stage moves from the original neutral position (herein, this means the center line X—X' of nozzle alignment coincident with the center axis Y—Y' of the substrate stage) toward the right side and returns back to the neutral position moving toward the left side, and next in the similar way, the substrate stage moves from the neutral position toward the left side and returns back again to the neutral position, and these movements constitute one cycle of the growth steps. The mechanism in the apparatus for moving the substrate stage 2 is separately described later.

Each of four nozzles 4-1 to 4-4 has an inside diameter of 10 mm, and an alignment pitch of four nozzles is set to be 20 mm. A substrate 3 is arranged on the substrate stage 2 having a distance of 30 mm apart from the nozzle tips. In the similar way as in the first embodiment, a mixed source gas or Hg, DIP-Te and DM-Cd is supplied to each nozzle, thereby partial pressures of Hg and DIP-Te being kept at constant values of $1 \times 10^{-3}$ atm and $1 \times 10^{-4}$ atm respectively for all nozzles irrespective of the substrate stage movement. The substrate 3 is heated at a temperature of about 350° C.

However, respective DM-Cd partial pressure for each nozzle is precisely controlled at an appropriate value which is determined by a distance between the substrate position directly beneath the respective nozzle tip and the substrate rotation center. Therefore, every time when the substrate moves in the horizontal direction, partial pressure for four nozzles should be changed at the predetermined data, and thus an amount of DM-Cd source gas in the mixed source gas flowing through each nozzle is controlled. The control data are stored in a computer unit attached to the apparatus, which is described later.

The growth method of the second embodiment is explained more definitely following the detailed steps. A first step (hereinafter denoted as Neutral step) begins when the center axis Y—Y' of substrate stage 2 is coincident with the symmetrical center line X—X' of the nozzle alignment. DM-Cd partial pressures for nozzles 4-1, 4-2, 4-3 and 4-4 are controlled at 3.0, 1.0, 1.0 and 3.0 ($\times 10^{-5}$ atm) respectively, and this condition is maintained for 1 min for the growth. It is assumed that other growth conditions of such as Hg and DIP-Te source gases, substrate temperature, gas flow rate, etc. are maintained constant, therefore they are omitted.

Next as a second step (hereinafter denoted as R-1 step), the substrate stage moves toward the right side by 2 mm, and DM-Cd partial pressures are changed to 3.2, 1.2, 0.8 and 2.8 ($\times 10^{-5}$ atm) respectively, and this condition is maintained for 1 min for the growth.

Next as a third step (hereinafter denoted as R-2 step), the substrate stage moves further toward the right side by 2 mm (4 mm from the first step), and DM-Cd partial pressures are changed to 3.4, 1.4, 0.6 and 2.6 ($\times 10^{-5}$ atm) respectively, and this condition is maintained for 1 min for the growth.

Next as a fourth step (hereinafter denoted as R-3 step), the substrate stage moves further toward the right side by 2 mm (6 mm from the first step), and DM-Cd partial pressures are changed to 3.6, 1.6, 0.4 and 2.4 ($\times 10^{-5}$ atm) respectively, and this condition is maintained for 1 min for the growth.

Next as a fifth step (hereinafter denoted as R-4 step), the substrate stage moves further toward the right side by 2 mm (8 mm from the first step), and DM-Cd partial pressures are changed to 3.8, 1.8, 0.2 and 2.2 ($\times 10^{-5}$ atm) respectively, and this condition is maintained for 1 min for the growth.

Next as a sixth step (hereinafter denoted as R-5 step), the substrate stage moves further toward the right side by 2 mm (10 mm from the first step), and DM-Cd partial pressures are changed to 4.0, 2.0, 0.2 and 2.2 ($\times 10^{-5}$ atm) respectively, and this condition is maintained for 1 min for the growth. The above steps are shown in Table 2.

Subsequent growth steps repeat the above steps the reverse order in the following way, $R\text{-}4 => R\text{-}3 => R\text{-}2 => R\text{-}1 =>$ Neutral.

TABLE 2

| Step | Distance D | DM-Cd Partial Pres. $\times 10^{-5}$ atm | | | | Time |
|---|---|---|---|---|---|---|
| | | 4-1 | 4-2 | 4-3 | 4-4 | |
| Neutral | 0 mm | 3.0 | 1.0 | 1.0 | 3.0 | 1 min |
| R-1 | 2 mm | 3.2 | 1.2 | 0.8 | 2.8 | 1 min |
| R-2 | 4 mm | 3.4 | 1.4 | 0.6 | 2.6 | 1 min |
| R-3 | 6 mm | 3.6 | 1.6 | 0.4 | 2.4 | 1 min |
| R-4 | 8 mm | 3.8 | 1.8 | 0.2 | 2.2 | 1 min |
| R-5 | 10 mm | 4.0 | 2.0 | 0.2 | 2.2 | 1 min |

TABLE 3

| Step | Distance D | DM-Cd Partial Pres. $\times 10^{-5}$ atm | | | | Time |
|---|---|---|---|---|---|---|
| | | 4-1 | 4-2 | 4-3 | 4-4 | |
| Neutral | −0 mm | 3.0 | 1.0 | 1.0 | 3.0 | 1 min |
| L-1 | −2 mm | 2.8 | 0.8 | 1.2 | 3.2 | 1 min |
| L-2 | −4 mm | 2.6 | 0.6 | 1.4 | 3.4 | 1 min |
| L-3 | −6 mm | 2.4 | 0.4 | 1.6 | 3.6 | 1 min |
| L-4 | −8 mm | 2.2 | 0.2 | 1.8 | 3.8 | 1 min |
| L-5 | −10 mm | 2.2 | 0.2 | 2.0 | 4.0 | 1 min |

Thereafter the substrate stage 2 moves toward the left side and returns back to the initial position in the similar way. The growth condition of each step are shown in Table 3, and the growth follows the sequence of L-1, L-2, L-3, L-4, L-5, L-4, L-3, L-2, L-1 and the Neutral, thus completing one cycle of the growth process.

By repeating the above steps of one cycle, the required thickness of $Hg_{1-x}Cd_xTe$ compound semiconductor layer can be obtained.

In the first and second embodiments, a plurality of nozzles are utilized, however, the method of the present invention is not limited to the plural nozzle system. A third embodiment of growth method shows that the method of the present invention can be applied to an apparatus having a single nozzle.

In the third embodiment, a substrate stage 2 moves stepwise to the right side in the way that a distance D between the rotation axis Y—Y' of the substrate stage and the center line X—X' of the single nozzle increases such as 2 mm, 10 mm, 20 mm, 30 mm and 40 mm, thereafter returns back to the initial condition decreasing the distance such as 30 mm, 20 mm, 10 mm and 2 mm. Each step continues for about 1 min. DM-Cd partial pressure in the mixed source gas are controlled to be $1.0 \times 10^{-5}$, $2.0 \times 10^{-5}$, $4.0 \times 10^{-5}$, $6.0 \times 10^{-5}$ and $8.0 \times 10^{-5}$ (atm) depending on the distance value of 2 mm, 10 mm, 20 mm, 30 mm and 40 mm respectively. Other conditions are substantially the same as those in the first or second embodiments.

A CVD apparatus for growing a semiconductor layer generally uses a fixed substrate stage in a react ion chamber. The method of growing a mixed compound semiconductor in accordance with the present invention necessitates to use a movable substrate stage in at least one direction. Even in the first embodiment in which the substrate stage is fixed, the substrate stage is arranged have a deviation from the center line of the nozzle alignment. Therefore, it is convenient to use a movable substrate stage in order to adjust the deviation.

Figure 7:
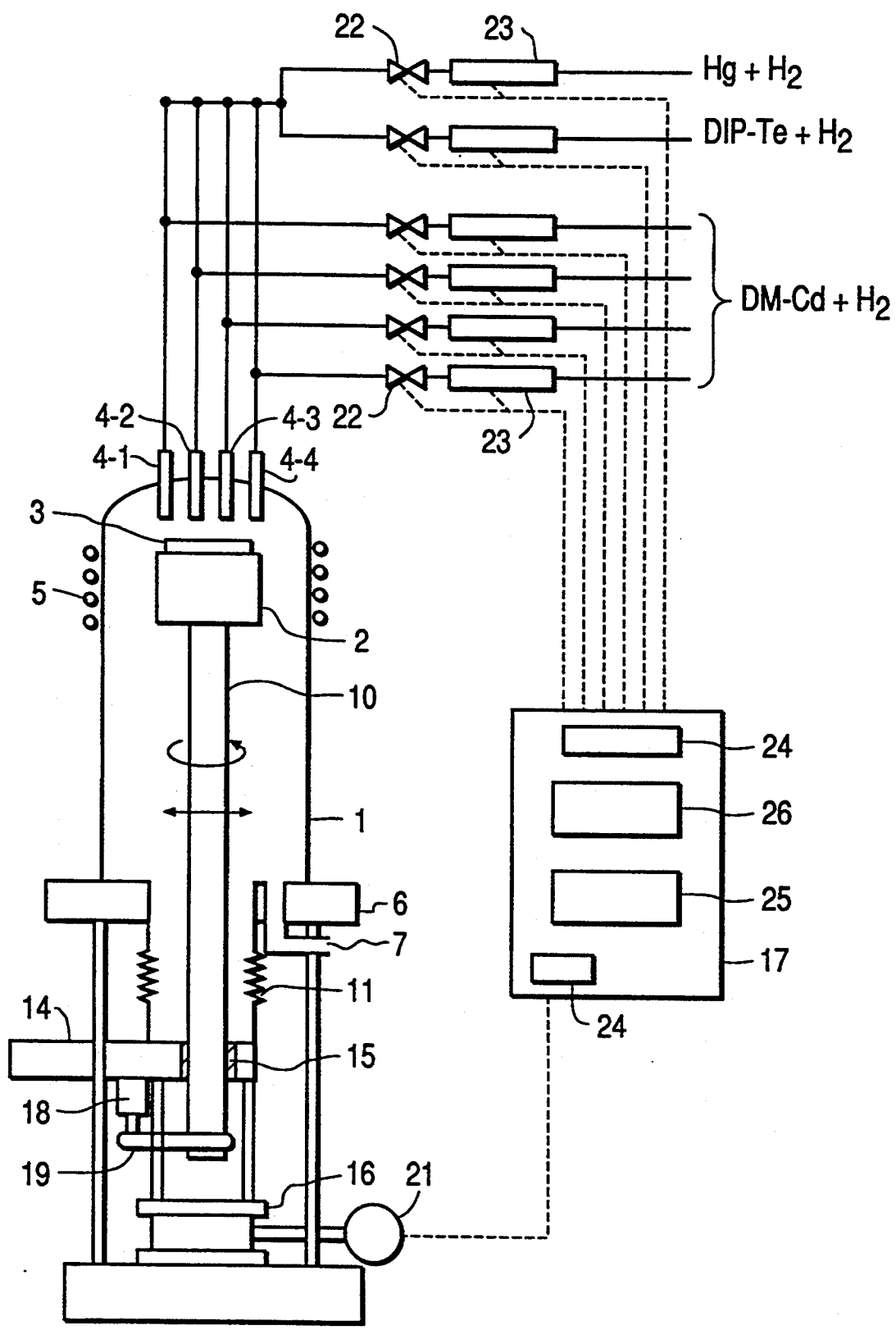
FIG. 7 shows a cross sectional view of an apparatus in accordance with the present invention, in which a movable stage together with a center support and a substrate stage moves in the horizontal direction under the control of a controller.

FIG. 7 shows a cross sectional view of an embodied apparatus for applying the method of the present invention. A substrate 3 is disposed on a substrate stage 2 having a center support 10, which can rotate by a drive mechanism of motor 18 and belt 19. A reactor chamber 1 is provided with, for example, four nozzles 4-1 to 4-4 at the top portion thereof for supplying source gases and arranged on a fixed flange 6, and an outlet pipe 7 for exhaust is provided with the fixed flange 6. Number of nozzles changes depending on a substrate size, reactor chamber size, etc. A movable flange 14 which is connected to the fixed flange 6 by a flexible corrugated tube 11, forms a part of an airtight enclosure and rotatably seals the center support 10 by a magnetic seal 15.

Separately, a movable stage 16 which is movable two-dimensionally in the XY plane, is provided, the XY plane being vertical to the center axis of the reactor chamber, namely, a gas flow direction of the nozzle. The movable stage 16 supports the movable flange 14 and moves it together with center support 10 and substrate stage 2. The growth method or the present invention needs only one-dimensional movement or the substrate stage, therefore, only a single motor 21 which drives the movable stage 16 in the X-direction, is shown in FIG. 7, herein the X-direction being defined for the direction of the nozzle alignment.

Outside the reaction chamber 1 and the other support members previously described, source gas sources for supplying a Hg source gas, DIP-Te source gas and DM-Cd source gas, and a controller 17 are shown, and other system of bubblers and hydrogen carrier gas sources, etc. are omitted for simplicity. Since partial gas pressures or the Hg or DIP-Te source gas supplied to four nozzles 4-1 to 4-4 are equal, only one control valve 22 and one mass flow controller 23 are schematically illustrated, however, with regard to the DM-Cd source gas, gas flow through each of four nozzles should be separately controlled in accordance with the growth method of the present invention. Therefore in FIG. 7, control valve 22 and mass flow controller 23 are inserted in each DM-Cd source gas supply line.

Each pair of control valve 22 and mass flow controller 23 are connected to the controller 17 by a control signal line. The motor 21 which moves the movable stage 16 is also connected to the controller 17 by a signal line. The controller comprises an interface unit 24, a data processing unit 26, memory unit 25, etc. Necessary data and program for controlling gas flows and movement of the movable stage 16 in accordance with the method of the invention previously described are stored in the memory unit 25.

in applying the first embodiment of the method, six nozzles are provided for the reactor chamber 1, and the motor 21 is controlled at the initial stage of the growth to have the deviation D shown FIG. 5, and the substrate stage 2 is fixed at this position in the X-direction and subjected to the rotation control only. Each partial pressure of DM-Cd controlled source gas is in accordance with Table 1.

In applying the second embodiment of the method, the reactor chamber 1 with four nozzle as shown in FIG. 7 is utilized. Partial gas pressures of DM-Cd source gas for four nozzles are controlled depending on the movement of the substrate stage 2 as given in Tables 2 and 3.

In applying the third embodiment of the method, the reactor chamber with a single nozzle is enough for the growth. Only DM-Cd partial pressure is controlled depending on the movement of the substrate stage 2 in the X-direction.

Figure 8:
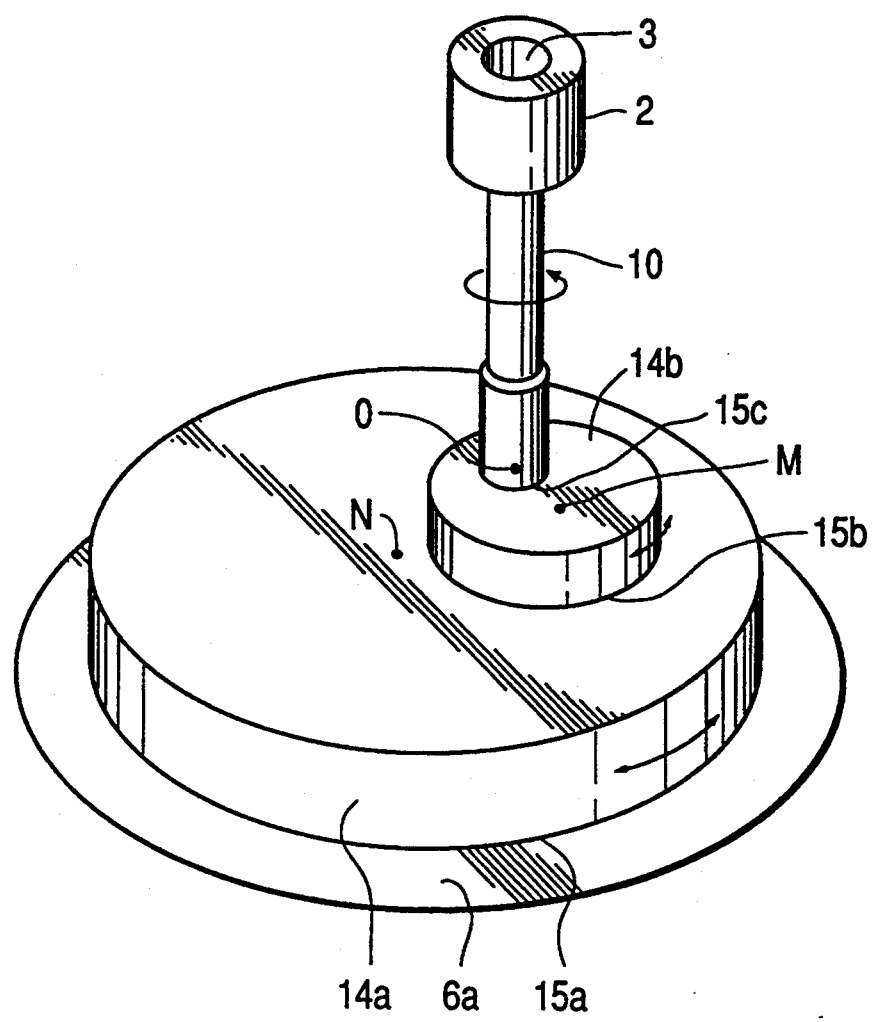
FIG. 8 shows a perspective view of another mechanism for moving a center support together with a substrate stage according to the present invention.

The above apparatus of FIG. 7 requires the flexible tube 11 and the movable stage 16 which includes a precision mechanism. An easy handling mechanism for moving a center support 10 and a substrate stage 2 is illustrated in FIG. 8. A center support 10 integrated with the substrate stage 2 rotates around its center axis in the same way. Two first and second rotatable flanges 14a and 14b are used. The first rotatable flange 14a is inserted concentrically in a fixed flange 6a having a magnetic seal 15a therebetween and, therefore, it can rotate by a motor (not shown) attached thereto. The second rotatable flange 14b is inserted eccentrically into the first rotatable flange 14a having a magnetic seal 15b therebetween. The center support 10 is also inserted eccentrically in the second rotatable flange 14b having a magnetic seal 15c therebetween.

The rotation centers of first and second rotatable flange 14a, 14b and center support 10 are denoted as N, M an O on the XY-plane, and it is assumed that deviation distances of the rotation centers M and O from the rotation centers N and M respectively, namely, distances between N and M, and between M and O have been properly selected. When the first and second rotatable flanges 14a and 14b revolves within the respective specific angle, the axis of the center support 10 (locus of O) moves substantially on a line.

Figure 9:
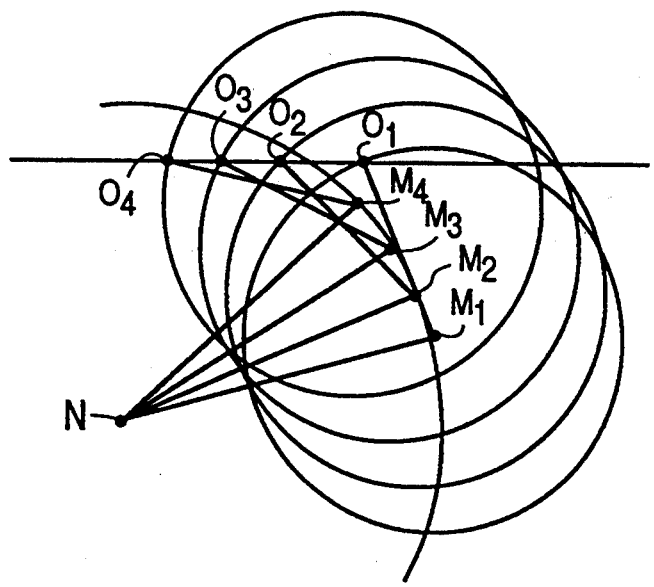
FIG. 9 illustrates schematically the movement of the axis of the center support when the mechanism of FIG. 8 is used, which shows that the axis of the center support moves substantially linear.

This is schematically illustrated in FIG. 9. It is assumed at time $T_1$, the center M of second flange 14b is located at $M_1$ and the center O of center support 10 is located at $O_1$. Next at time $T_2$, due to the rotation of the first flange 14a, $M_1$ moves to $M_2$, and $O_1$ moves to $O_2$. At time $T_3$, $M_2$ moves to $M_3$, and $O_2$ moves to $O_3$. At time $T_4$, $M_3$ moves to $M_4$, and $O_3$ moves to $O_4$. The loci or $O_1$, $O_2$, $O_3$ and $O_4$ are located substantially on a line.

If the deviation distances N-M and M-O, and the back and forth revolving angles of the first and second flanges 14a, 14b are selected at proper values in design computation, substantially linear back and forth movement of the substrate stage 2 in the X-direction can be realized.

The disclosure has been provided with respect to an application for growing the $Hg_{1-x}Cd_xTe$ compound semiconductor, but it is obvious that the invention may be applied for growing any other compound semiconductor layer involving the similar problem. The presently disclosed embodiments are, therefore, to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. An apparatus for growing a mixed compound semiconductor comprising:
   a reactor chamber arranged on a fixed flange,
   a substrate stage for supporting a substrate having a substrate surface,
   a center support fixed to the substrate stage, the center support being rotatable around the center axis thereof,
   at least one nozzle arranged to direct gas vertically onto the substrate surface,
   means for heating the substrate,
   means for imparting a translational movement to said center support and the substrate stage in a plane parallel to the substrate surface,
   means for controlling a gas flow rate through said at least one nozzle, and
   coupling means for coupling said means for imparting a translational movement and said means for controlling a gas flow rate so that the gas flow rate through the at least one nozzle depends on a distance between the center axis of the substrate rotation and said at least one nozzle.

2. An apparatus for growing a mixed compound semiconductor as recited in claim 1, wherein said means for imparting a translational movement comprises a movable flange and a movable stage mutually fixed with each other, the movable flange being connected to said fixed flange by a flexible tube and provided with means for supporting said center support rotatably and in an airtight fashion, said center support extending from the movable stage through the flexible tube and the fixed flange into said reaction chamber, and the movable stage being adapted for imparting a translational movement in a plane parallel to the substrate surface.

3. An apparatus for growing a mixed compound semiconductor as recited in claim 1,
   wherein said means for imparting a translational movement comprises first and second rotatable flanges and means for revolving the first and second rotatable flanges within a specified angle,
   wherein said center support is engaged rotatably and in an airtight fashion in the second rotatable flange, the first rotatable flange is engaged rotatably and in an airtight fashion in said fixed flange, and the second rotatable flange is engaged rotatably and in an airtight fashion in the first rotatable flange,
   wherein the axis of rotation of the second rotatable flange is offset by a first deviation distance from the axis of rotation of the first rotatable flange, and the center axis of the center support is offset by a second deviation distance from the axis of rotation of the second rotatable flange, and
   wherein the first and second deviation distances are selected to allow the center axis of said center support to move substantially linearly.

4. An apparatus for growing a mixed compound semiconductor as recited in claim 1, wherein said at least one nozzle is a plurality of nozzles aligned in a nozzle alignment direction, said means for imparting a translational movement comprises means for imparting a translational movement in said nozzle alignment direction, and said coupling means and said means for controlling a gas flow rate separately control a gas flow rate through each nozzle of said plurality of nozzles depending on the distances between the center axis of the substrate rotation and the respective nozzles of the plurality of nozzles.

5. An apparatus for growing a mixed compound semiconductor as recited in claim 2, wherein said center axis of the substrate support is offset from a symmetrical center line of said at least one nozzle by a predetermined distance.

* * * * *

UNITED STATES PATENT AND TRADEMARK OFFICE
CERTIFICATE OF CORRECTION

PATENT NO. : 5,431,738
DATED : July 11, 1995
INVENTOR(S) : Satoshi MURAKAMI et al.

It is certified that error appears in the above-indentified patent and that said Letters Patent is hereby corrected as shown below:

<u>Title Page</u>, [57] Abstract line 1, change "or" to --of--.

<u>Col. 4</u>, line 1, change "value" to --x-value--; and
line 50, change "or" to --of--.

<u>Col. 7</u>, line 54, change "react ion" to --reaction--.

Signed and Sealed this

Twenty-fourth Day of October, 1995

Attest:

BRUCE LEHMAN

Attesting Officer    Commissioner of Patents and Trademarks